United States Patent
Shima et al.

(10) Patent No.: US 10,211,165 B2
(45) Date of Patent: Feb. 19, 2019

(54) METHOD OF MANUFACTURING SEMICONDUCTOR DEVICE AND SEMICONDUCTOR DEVICE

(71) Applicant: Toshiba Memory Corporation, Tokyo (JP)

(72) Inventors: Masaya Shima, Yokkaichi Mie (JP); Eiji Takano, Nagoya Aichi (JP); Ippei Kume, Yokkaichi Mie (JP); Yuki Noda, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,970

(22) Filed: Sep. 4, 2017

(65) Prior Publication Data

US 2018/0277493 A1   Sep. 27, 2018

(30) Foreign Application Priority Data

Mar. 22, 2017 (JP) .................. 2017-056174

(51) Int. Cl.
*H01L 21/768* (2006.01)
*H01L 21/56* (2006.01)
(Continued)

(52) U.S. Cl.
CPC ...... *H01L 23/562* (2013.01); *H01L 21/67092* (2013.01); *H01L 21/76898* (2013.01);
(Continued)

(58) Field of Classification Search
CPC ......... H01L 21/78; H01L 21/70; H01L 21/71; H01L 21/027; H01L 21/67092;
(Continued)

(56) References Cited

U.S. PATENT DOCUMENTS 7,199,449 B2   4/2007 Lake
7,795,115 B2   9/2010 Kameyama et al.
(Continued)

FOREIGN PATENT DOCUMENTS

JP   2013206921 A   10/2013
TW   201017850 A   5/2010
(Continued)

OTHER PUBLICATIONS

Taiwan Office Action dated Jan. 10, 2018, filed in Taiwan counterpart Application No. 106122791, 6 pages (with translation).

*Primary Examiner* — Dao H Nguyen
(74) *Attorney, Agent, or Firm* — Patterson & Sheridan, LLP

(57) ABSTRACT

A method of manufacturing a semiconductor device includes stacking a first substrate comprising a first surface having a semiconductor element and an opposing second surface and a second substrate comprising a third surface having a semiconductor element and an opposing fourth surface, forming a first contact hole extending from the second surface to the first surface of the first substrate and forming a first groove inwardly of a first region of the second surface of the first substrate by etching inwardly of the first substrate from the second surface thereof, forming a first patterned mask on the first substrate, so that the first groove is covered by the material of the first patterned mask, forming a first metal electrode in the first contact hole through an opening in the first mask as a mask, and removing the first mask and subsequently cutting through the first substrate in the first groove.

14 Claims, 18 Drawing Sheets

(51) Int. Cl.
*H01L 23/532* (2006.01)
*H01L 25/00* (2006.01)
*H01L 23/00* (2006.01)
*H01L 21/78* (2006.01)
*H01L 25/065* (2006.01)
*H01L 23/48* (2006.01)
*H01L 23/31* (2006.01)
*H01L 23/40* (2006.01)
*H01L 21/67* (2006.01)

(52) U.S. Cl.
CPC .......... *H01L 21/78* (2013.01); *H01L 23/3171* (2013.01); *H01L 23/4012* (2013.01); *H01L 23/481* (2013.01); *H01L 24/11* (2013.01); *H01L 24/13* (2013.01); *H01L 25/0657* (2013.01); *H01L 25/50* (2013.01); *H01L 2224/1146* (2013.01); *H01L 2224/13025* (2013.01); *H01L 2224/13147* (2013.01); *H01L 2225/06544* (2013.01); *H01L 2225/06586* (2013.01)

(58) Field of Classification Search
CPC ......... H01L 21/32139; H01L 21/76898; H01L 23/4012; H01L 23/481; H01L 23/562; H01L 23/3171; H01L 24/11; H01L 24/13; H01L 25/043; H01L 25/50; H01L 25/0657; H01L 41/338
USPC ............... 257/618, 621, 668, 712, 737, 774, 257/E21.238, E21.499, E21.502, E21.506, 257/E21.536, E21.538, E21.705, E23.011, 257/E23.068, E23.141, E23.194; 438/106, 109, 114, 462
See application file for complete search history.

(56) References Cited

U.S. PATENT DOCUMENTS

| | | | |
|---|---|---|---|
| 8,563,349 B2 | 10/2013 | Myung et al. | |
| 9,425,170 B2 | 8/2016 | Kikuchi | |
| 9,431,321 B2 | 8/2016 | Watanabe et al. | |
| 9,947,626 B2 * | 4/2018 | Chen | H01L 24/20 |
| 2008/0006931 A1 * | 1/2008 | Oliver | H01L 21/561 |
| | | | 257/712 |
| 2009/0042365 A1 | 2/2009 | McDonald | |
| 2010/0168916 A1 | 7/2010 | Lin et al. | |
| 2011/0026232 A1 * | 2/2011 | Lin | H01L 21/76898 |
| | | | 361/760 |
| 2011/0031633 A1 * | 2/2011 | Hsu | H01L 21/76898 |
| | | | 257/777 |
| 2013/0075924 A1 * | 3/2013 | Lin | H01L 24/19 |
| | | | 257/774 |
| 2016/0260674 A1 | 9/2016 | Jones et al. | |
| 2018/0012863 A1 * | 1/2018 | Yu | G06K 9/00006 |
| 2018/0158749 A1 * | 6/2018 | Yu | H01L 23/3677 |

FOREIGN PATENT DOCUMENTS

| | | |
|---|---|---|
| TW | 201230221 A | 7/2012 |
| TW | 201630147 A | 8/2016 |

* cited by examiner

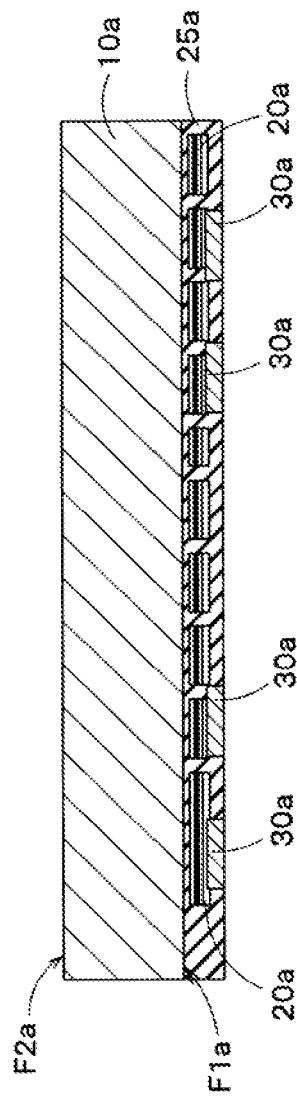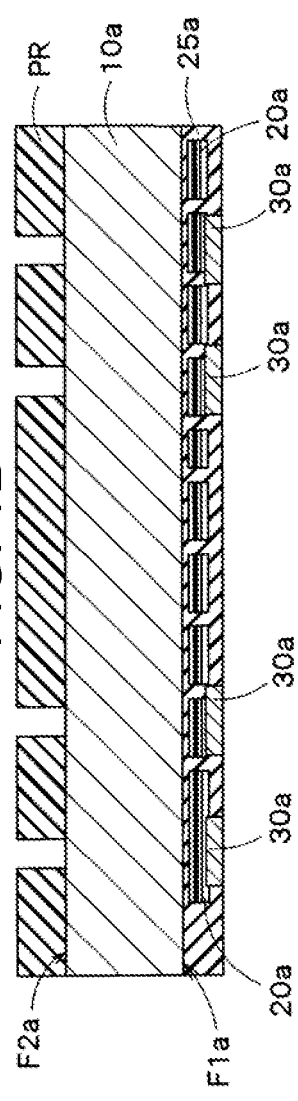

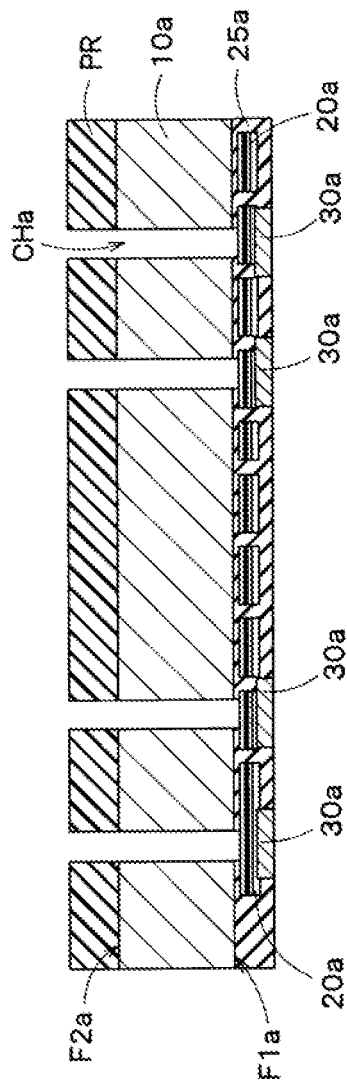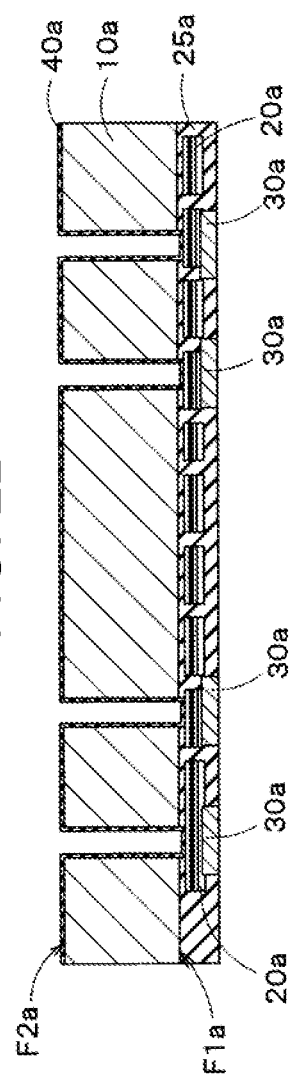

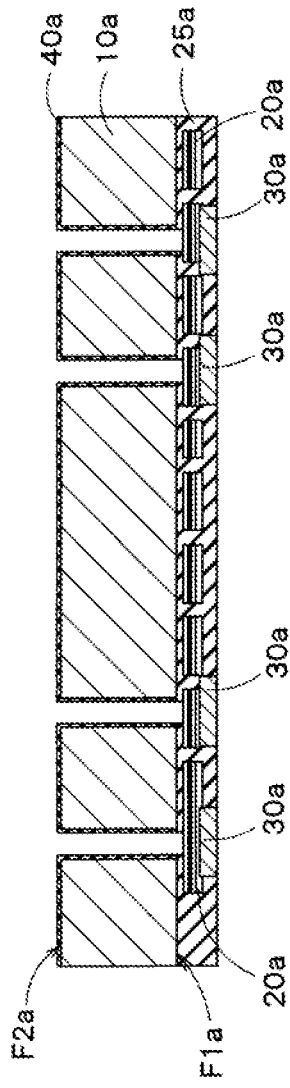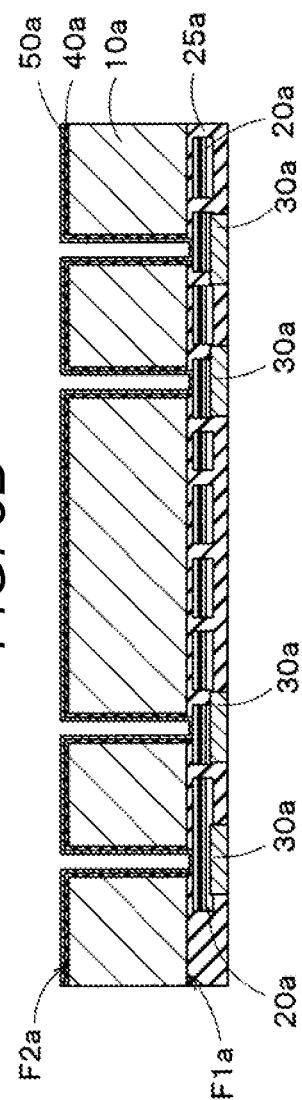

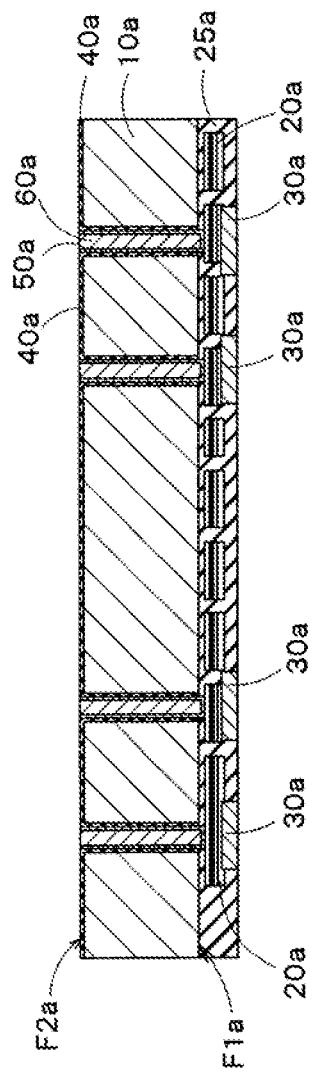
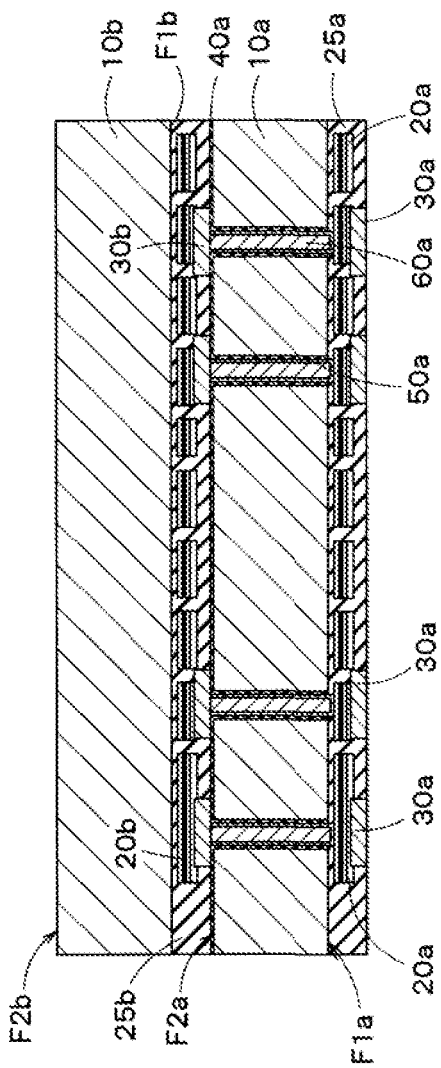

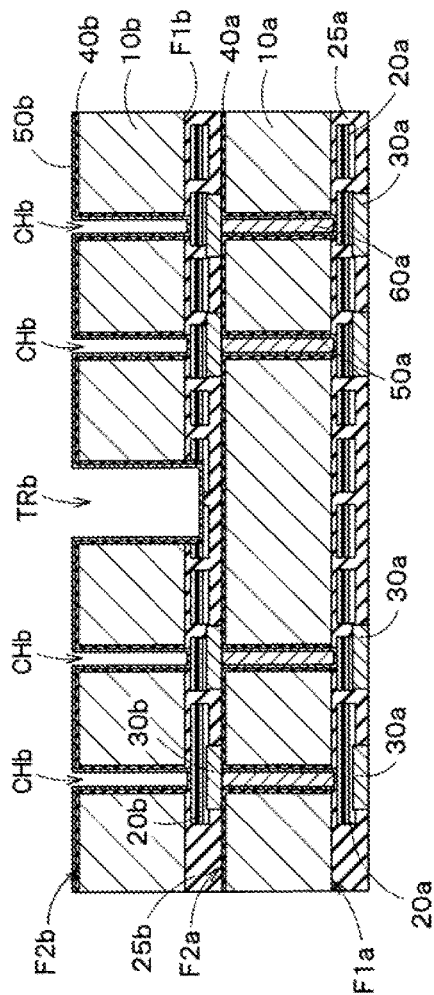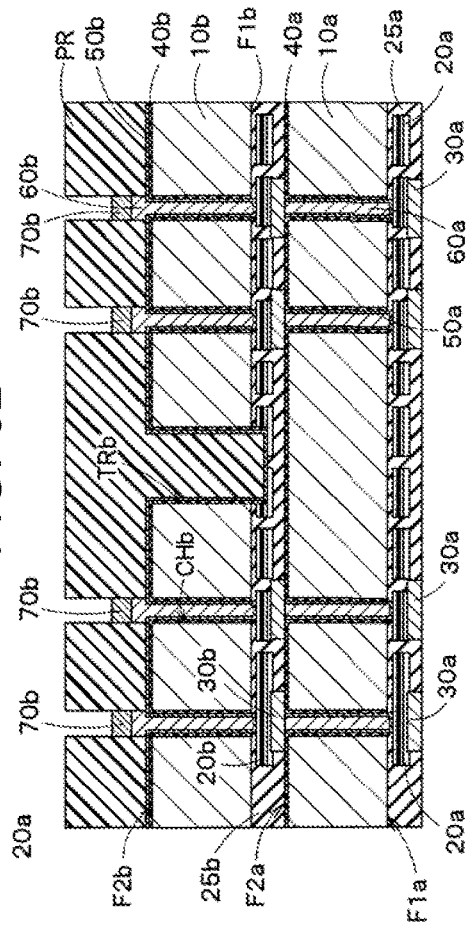

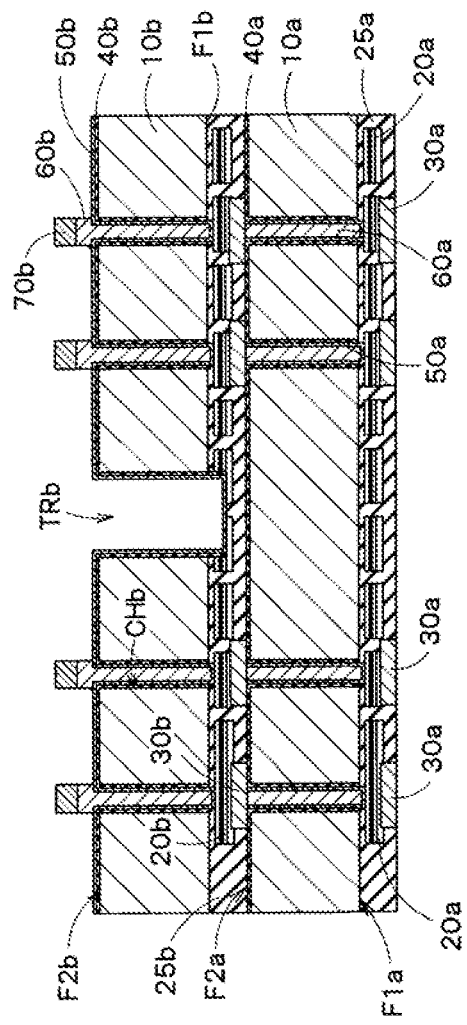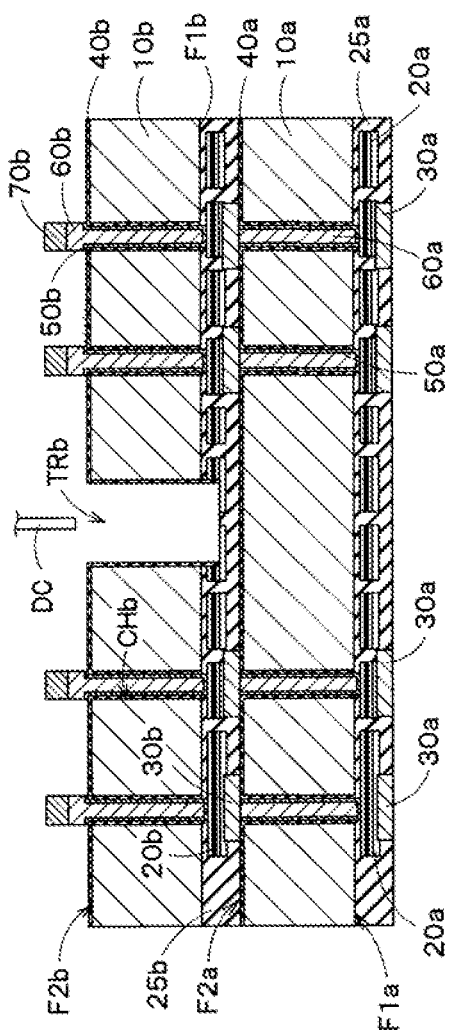

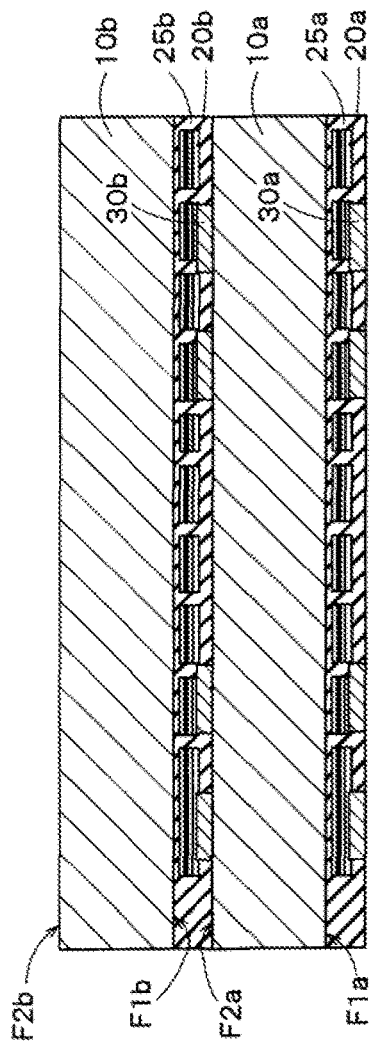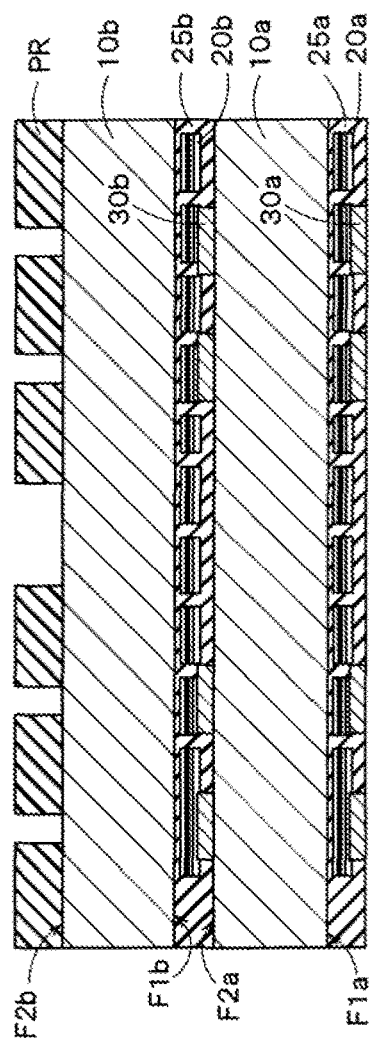

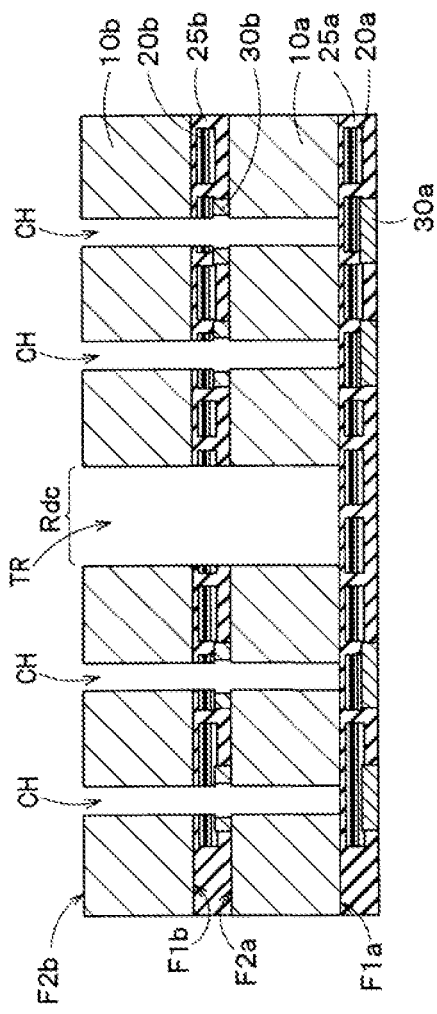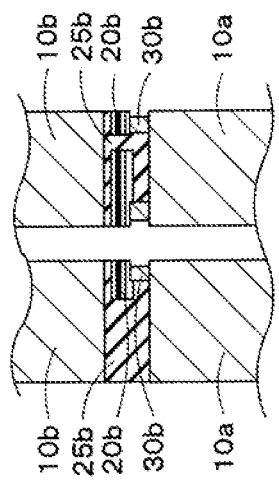

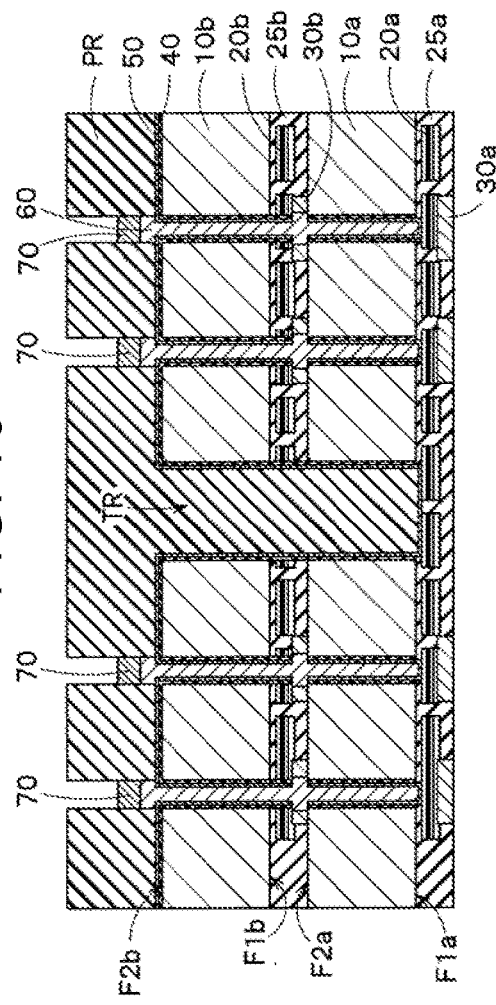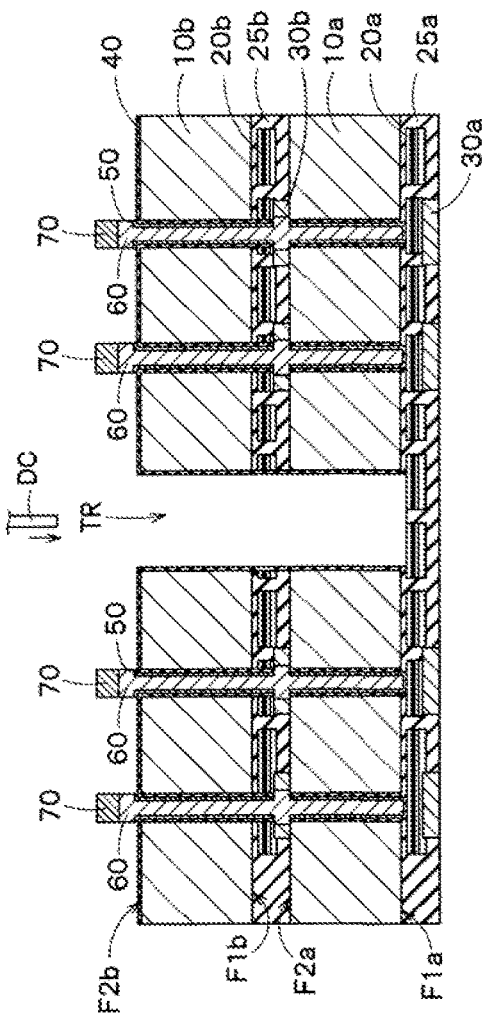

METHOD OF MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2017-056174, filed Mar. 22, 2017, the entire contents of which are incorporated herein by reference.

FIELD

Embodiments described herein relate to a method of manufacturing a semiconductor device and the semiconductor device.

BACKGROUND

Technologies for reducing the size of a semiconductor device by stacking a plurality of semiconductor chips on one another have been developed. The stacked semiconductor chips are electrically connected by a through metal line known as a through-silicon via (TSV).

In the related art, such a semiconductor device was manufactured such that semiconductor wafers are singulated into semiconductor chips by dicing, and subsequently a plurality of semiconductor chips are stacked one over the other to form the final device. On the other hand, a plurality of semiconductor wafers may be first stacked one over the other and subsequently diced collectively to form the individual stacked chip devices. However, when the plurality of stacked semiconductor wafers are diced simultaneously, there is a problem of the stack of wafers being easily damaged due to chipping, cracks, or the like along the cut surface, impacting the utility of the singulated die.

DESCRIPTION OF THE DRAWINGS

FIGS. 1A and 1B are sectional views illustrating an example of a method of manufacturing a semiconductor device according to a first embodiment.

FIGS. 2A and 2B are sectional views illustrating an example of the method of manufacturing the semiconductor device after FIGS. 1A and 1B.

FIGS. 3A and 3B are sectional views illustrating an example of the method of manufacturing the semiconductor device after FIGS. 2A and 2B.

FIGS. 4A and 4B are sectional views illustrating an example of the method of manufacturing the semiconductor device after FIGS. 3A and 3B.

FIGS. 6A and 6B are sectional views illustrating an example of the method of manufacturing the semiconductor device after FIGS. 5A and 5B.

FIGS. 7A and 7B are sectional views illustrating an example of the method of manufacturing the semiconductor device after FIGS. 6A and 6B.

FIGS. 12A and 12B are sectional views illustrating an example of a method of manufacturing a semiconductor device according to a fourth embodiment.

FIGS. 13A and 13B are sectional views illustrating an example of the method of manufacturing the semiconductor device after FIGS. 12A and 12B.

FIG. 16 is a sectional view illustrating an example of the method of manufacturing the semiconductor device after FIGS. 15A and 15B.

FIG. 17 is a sectional view illustrating an example of the method of manufacturing the semiconductor device after FIG. 16.

DETAILED DESCRIPTION

Figure 5A:
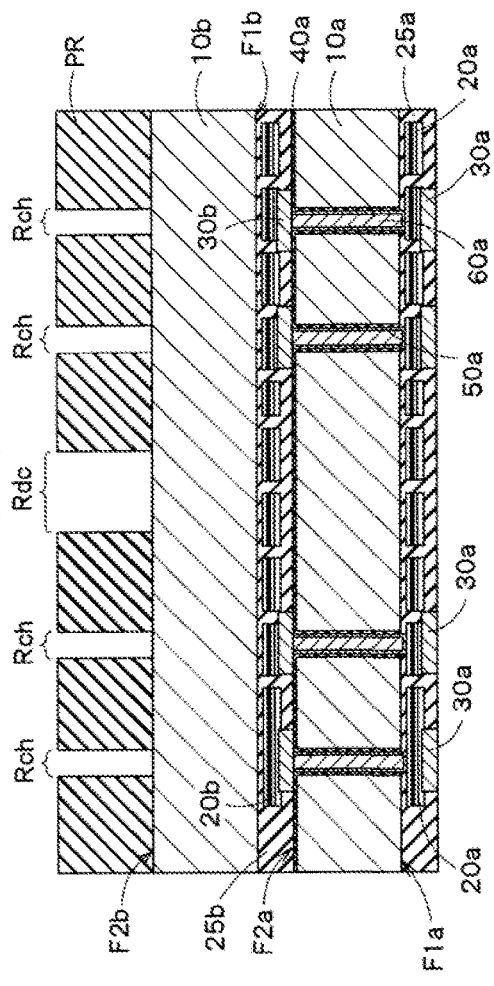
FIGS. 5A and 5B are sectional views illustrating an example of the method of manufacturing the semiconductor device after FIGS. 4A and 4B.

Embodiments provide a method of manufacturing a semiconductor device capable of stacking a plurality of semiconductor wafers and fragmenting the semiconductor wafers collectively while preventing damage of the semiconductor wafers and the semiconductor device.

In general, according to one embodiment, a method of manufacturing a semiconductor device includes stacking a first semiconductor substrate comprising a first surface having a semiconductor element and a second surface opposite to the first surface and a second semiconductor substrate comprising a third surface having a semiconductor element and a fourth surface opposite to the third surface, forming a first contact hole extending from the second surface to the first surface of the first semiconductor substrate and forming a first groove inwardly of a first region of the second surface of the first semiconductor substrate by etching inwardly of the first semiconductor substrate from the second surface thereof, forming a first patterned mask on the first semiconductor substrate, so that the first groove is covered by the material of the first patterned mask, forming a first metal electrode in the first contact hole through an opening in the first mask as a mask, and removing the first mask and subsequently cutting through the first semiconductor substrate in the first groove.

Hereinafter, exemplary embodiments will be described with reference to the drawings. The present disclosure is not limited to the embodiments. In the following embodiments, a vertical direction of a semiconductor substrate indicates a relative direction when a front surface on which semiconductor elements are formed or a rear surface opposite to the front surface are oriented upward and it may be different from the vertical direction of the acceleration of gravity.

First Embodiment

FIGS. 1A to 8 are sectional views illustrating an example of a method of manufacturing a semiconductor device according to a first embodiment. FIGS. 1A to 8 illustrate cross-sections of portions of substrates 10a and 10b. In the first embodiment, TSVs are formed as metal electrodes in both the semiconductor substrates 10a and 10b, and the semiconductor substrate 10b is stacked on the semiconductor substrate 10a. The semiconductor substrates 10a and 10b may be semiconductor substrates each including, for example, a NAND type electrically erasable and programmable read-only memory (EEPROM). The semiconductor substrates 10a and 10b are in a wafer state before dicing and are not individually singulated into semiconductor chips.

Semiconductor substrate 10a has a third (major) surface F1a, and a fourth (major) surface F2a, opposite on the substrate to, and facing away from, third surface F1a. Semiconductor substrate 10b has a first (major) surface F1b, and a second (major) surface F2b, opposite on the substrate to, and facing away from, first surface F1b. First, a shallow trench isolation (STI) (not illustrated) is formed on a third surface F1a of the semiconductor substrate 10a serving as a second semiconductor substrate to define active area therein. The semiconductor substrate 10a is, for example, a silicon substrate. The STI is, for example, a silicon oxide film. Next, semiconductor elements (not illustrated) are formed in the active area. The semiconductor elements may be, for example, a memory cell array, a transistor, a resistance element, or a capacitor element. When the semiconductor elements are formed, for example, a wiring structure 20a is formed on the active area or the STI with an interlayer insulating film interposed therebetween. The semiconductor elements and the wiring structure 20a are covered with an insulating film 25a. Next, a pad 30a is formed connected to the wiring structure 20a. Accordingly, the wiring structure 20a and the pad 30a are formed as conductors on the active area or the STI. As the wiring structure 20a and the pad 30a, a low-resistance metal such as tungsten or titanium is used. Hereinafter, the wiring structure 20a and the pad 30a are also collectively called conductors 20a and 30a.

After the semiconductor elements and the like are formed on the third surface F1a of the fourth surface F2a of the semiconductor substrate 10a is polished and is thinned to a thickness of, for example, about 30 µm or less. Thus, the structure illustrated in FIG. 1A can be obtained. In FIG. 1A, the third surface F1a is shown facing downwardly.

As illustrated in FIG. 1B, a patterned resist film PR is formed on the fourth surface F2a using a lithography technology. The resist film PR covers a region other than the region of formation of a contact hole used for the TSV extending inwardly of the fourth surface F2a.

Next, as illustrated in FIG. 2A, the substrate 10a is etched inwardly from the fourth surface F2a using the resist film PR as a mask by a reactive ion etching (RIE) method. Thus, a contact hole CHa reaching from the fourth surface F2a to the third surface F1a is formed. In order to connect the TSV to the conductors 20a and 30a, the contact hole CHa is formed in regions in which the conductors 20a and 30a are present. Thus, the conductor 20a is exposed in a low portion of the contact hole CHa with respect to upwardly facing fourth surface F2a.

After the resist film PR is removed, as illustrated in FIG. 2B, a spacer film 40a is formed on the inner and bottom surfaces of the contact hole CHa and on the fourth surface F2a of the semiconductor substrate 10a using a chemical vapor deposition (CVD) method or an atomic layer deposition (ALD) method. As the spacer film 40a, for example, an insulating material such as a silicon oxide is used.

Next, as illustrated in FIG. 3A, the spacer film 40a at the bottom portion of the contact hole CHa is etched by etching back the spacer film 40a by the reactive ion etching (RIE) method. As the contact hole CHa has a large aspect ratio, the spacer film 40a when formed on the fourth surface F2a is relatively thick and it is barely formed on the bottom portion of the contact hole CHa. Accordingly, after etch back, the contact hole CHa penetrates through the spacer film 40a to reach the conductors 20a and 30a. That is, the contact hole CHa extends to the conductors 20a and 30a.

Next, as illustrated in FIG. 3B, a barrier metal 50a is formed in the contact hole CHa. For example, Ti or Cu is used for the barrier metal 50a.

Next, as illustrated in FIG. 4A, the metal material of a TSV 60a is deposited as a metal electrode in the contact hole CHa. For example, a metal material such as Cu is used for the TSV 60a. Thus, the TSV 60a and the barrier metal 50a can be connected to the conductors 20a and 30a.

Next, as illustrated in FIG. 4A, the portion of the TSV 60a extending above the fourth surface F2a is removed to provide a flat surface using a chemical mechanical polishing (CMP) method to remove the TSV 60a material and the barrier metal 50a on the fourth surface F2a while the TSV 60a and the barrier metal 50a in the contact hole CHa remain in place. Thus, the TSV 60a and the barrier metal 50a in the contact holes CHa are electrically isolated from each other across the fourth surface F2a.

Next, as illustrated in FIG. 4B, the semiconductor substrate 10b is stacked on the fourth surface F2a of the semiconductor substrate 10a. The semiconductor substrate 10b serving as a first semiconductor substrate has substantially the same configuration as the semiconductor substrate 10a in FIG. 1A. Accordingly, an STI (not illustrated) is formed on a first surface F1b of the semiconductor substrate 10b and semiconductor elements (not illustrated) are formed in an active area. For example, a wiring structure 20b is formed on the active area or the STI with an interlayer insulating film interposed therebetween. The semiconductor elements and the wiring structure 20b are covered with an insulating film 25b. A pad 30b is formed to be connected to the wiring structure 20b. Accordingly, the wiring structure 20b and the pad 30b are formed as conductors on the active area or the STI. Hereinafter, the wiring structure 20b and the pad 30b are collectively called conductors 20b and 30b.

After the semiconductor elements and the like are formed on the first surface F1b of the semiconductor substrate 10b, the semiconductor substrate 10b is polished from a second surface F2b opposite to the first surface F1b and is thinned to, for example, about 30 µm or less. Thus, a semiconductor substrate 10b that has the same configuration as the semiconductor substrate 10a is formed.

The semiconductor substrate 10b is stacked on the semiconductor substrate 10a so that the first surface F1b overlies the fourth surface F2a of the semiconductor substrate 10a. The semiconductor substrates 10a and 10b are stacked and subsequently adhered together by thermal compression. During this process, the pad 30b of the semiconductor substrate 10b comes into contact with the TSV 60a of the semiconductor substrate 10a so that the semiconductor substrates 10a and 10b are electrically connected together.

Next, as illustrated in FIG. 5A, a patterned resist film PR is formed on the second surface F2b using a lithography technology. The resist film PR covers a region other than a contact hole to be formed region Rch and a dicing region Rdc. The contact hole to be formed region Rch is a region in which a contact hole used for a TSV of the second surface F2b of the semiconductor substrate 10b is formed. The dicing region Rdc is a region of the substrate to be cut when the stacked semiconductor substrates 10a and 10b are singulated into individual semiconductor chips.

Figure 5B:
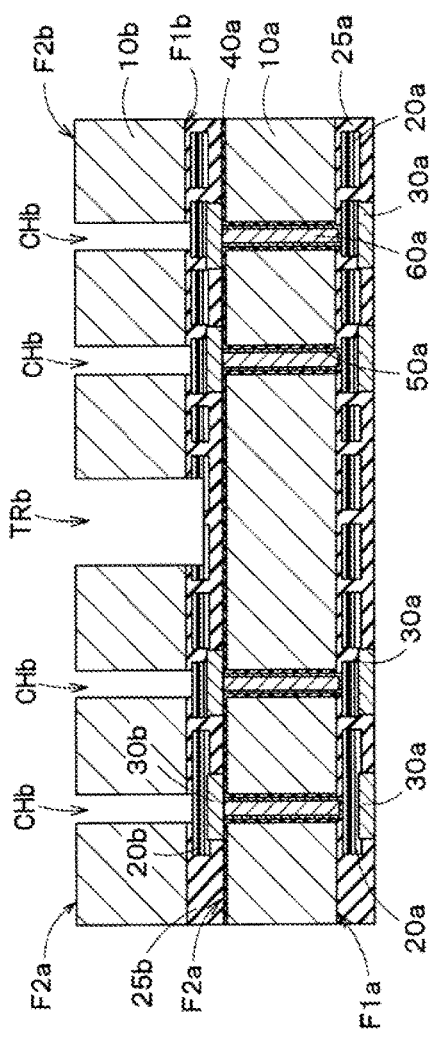

Next, as illustrated in FIG. 5B, the semiconductor substrate 10b is etched inwardly of the second surface F2b, using the resist film PR as a mask, by the RIE method. Thereby, a contact hole CHb is formed as a first contact hole reaching from the second surface F2b to the first surface F1b. In order to connect the TSV to the conductors 20b and 30b, the contact hole CHb is formed in regions in which the conductors 20b and 30b are present. Thus, the conductor 20b is exposed in a bottom portion of the contact hole CHb. A first groove TRb is formed in the dicing region Rdc serving as a first region of the second surface F2b.

Since the area of an opening of the first groove TRb is greater than the area of an opening of the contact hole CHb, the first groove TRb is inherently etched deeper than the contact hole CHb. Since the dicing region Rdc is a region cut by dicing, the first groove TRb may be formed to be deeper than the contact hole CHb without damage to the devices on the substrate. Herein, the first groove TRb is preferably formed deeply since a dicing cutter DC can more easily cut through the semiconductor substrates 10a and 10b in a later dicing process. However, the semiconductor substrates 10a and 10b are very thin. Therefore, when the first groove TRb is considerably deep, there is concern of cracks or the like occurring unintentionally before the dicing process. Accordingly, the first groove TRb may be formed shallower or may be formed only in a partial portion of the whole dicing region Rdc. The plan layout of the first groove TRb will be described later with reference to FIGS. 9A to 9D.

After the resist film PR is removed, as described with reference to FIGS. 2B to 3B, a spacer film 40b and a barrier metal 50b are formed. Thus, as illustrated in FIG. 6B, the spacer film 40b and the barrier metal 50b are formed on the inner surface of the contact hole CHb, the inner surface and the bottom surface of the first groove TRb, and on the second surface F2b of the semiconductor substrate 10b. The materials of the spacer film 40b and the barrier metal 50b are the same as the materials of the spacer film 40a and the barrier metal 50a.

Since the spacer film 40b on the bottom surfaces of the contact hole CHb and the first groove TRb are etched away by the RIE method, the spacer film 40b does not remain on the bottom surface of the contact hole CHb. The spacer film 40b serving as the first insulating film remains on the inner surfaces of the contact hole CHb and the first groove TRb. On the other hand, the barrier metal 50b is formed on the bottom surfaces of the contact hole CHb and the first groove TR. Thus, in the contact hole CHb, the barrier metal 50b is electrically connected to the conductors 20b and 30b while remaining electrically insulated from the substrate 10b.

Next, as illustrated in FIG. 6B, a region other than the contact hole CHb and its periphery is covered with the patterned resist film PR serving as first mask material formed using a lithography technology. At this time, the resist film PR is also formed on the first groove TRb to cover the first groove TRb.

Next, a TSV 60b serving as a first metal electrode is deposited in the contact hole CHb using the resist film PR as a mask. The material of the TSV 60b may be the same as the material of the TSV 60a. Thus, the TSV 60b can be electrically connected to the conductors 20b and 30b.

Next, a bump 70b is formed on the TSV 60b by a plating method also using the resist film PR in FIG. 6B as the mask. For example, a metal material which can be plated, such as tin or copper, is used for the bump 70b material. When the resist film PR is removed, the structure illustrated in FIG. 7A is obtained.

Next, as illustrated in FIG. 7B, the exposed barrier metal 50b is etched by wet-etching using the bump 70b and the TSV 60b as a mask. Thus, the barrier metal 50b on the second surface F2b and the barrier metal 50b on the inner surface of the first groove TRb are removed. Accordingly, adjacent TSVs 60b and bumps 70b are electrically isolated from each other. In contrast, the barrier metal 50b immediately below the bump 70b and the TSV 60b remains, so that the TSV 60b and the bump 70b remain electrically connected to the conductors 20b and 30b below the TSV 60b and the bump 70b.

Figure 8:
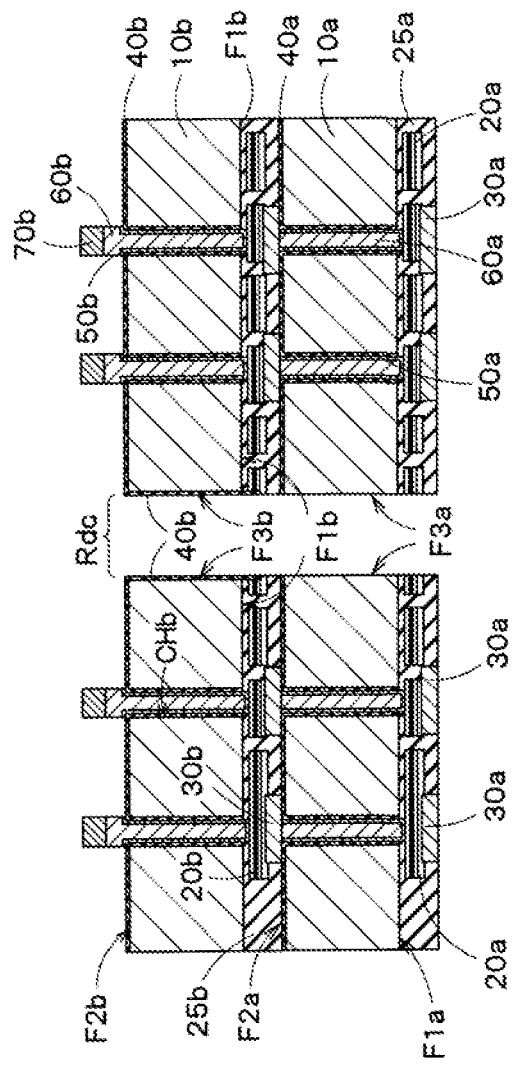
FIG. 8 is a sectional view illustrating an example of the method of manufacturing the semiconductor device after FIGS. 7A and 7B.

Thereafter, as illustrated in FIG. 8, the substrates 10a and 10b in the stacked state are diced into individual stacked devices. At this time, the dicing cutter DC cuts the substrates 10a and 10b in the dicing region Rdc in the first groove TRb illustrated in FIG. 5A. Thus, the stacked substrates 10a and 10b are singulated into stacked semiconductor chips. The stacked semiconductor chips are packaged with resin or the like to be completed as products.

According to the embodiment, the dicing cutter DC cuts the inside of the first groove TRb in the dicing process. Therefore, even when a plurality of stacked substrates 10a and 10b are diced at the same time, chipping, cracks, and the like rarely occur. Accordingly, it is possible to prevent damage to the semiconductor elements and the like formed in the substrates 10a and 10b. That is, even when a plurality of semiconductor wafers are stacked and subsequently singulated collectively, it is possible to prevent damage to the elements of the semiconductor wafers.

According to the embodiment, the dicing cutter DC cuts the inside of the first groove TRb. Therefore, the spacer film 40b remains left on the inner wall of the first groove TRb. Accordingly, after the substrates are singulated into the semiconductor chips, the side surface of the substrate 10b is covered with the spacer film 40b. Thus, it is possible to protect the substrate 10b from metal contamination or the like. When the first groove TRb is formed deeply and the spacer film 40b is formed on the side surfaces of the substrates 10a and 10b, it is possible to protect the substrates 10a and 10b from metal contamination or the like.

FIG. 8 is a sectional view illustrating an example of the configuration of the semiconductor device according to the first embodiment. The semiconductor device formed by the manufacturing method according to the foregoing embodiment has the configuration illustrated in FIG. 8.

The semiconductor device 1 includes the substrate 10a, the substrate 10b, the wiring structures 20a and 20b, the insulating films 25a and 25b, the pads 30a and 30b, the spacer films 40a and 40b, the barrier metals 50a and 50b, the TSVs 60a and 60b, and the bump 70b.

The substrate 10a serving as the second semiconductor substrate includes the third surface F1a having the semiconductor elements and the fourth surface F2a opposite to the third surface F1a. The semiconductor elements are formed in the active area of the substrate 10a. The wiring structure 20a is formed on the active area or the STI on the third surface F1a of the substrate 10a with the interlayer insulating film interposed therebetween. The semiconductor elements and the wiring structure 20a are covered with the insulating film 25a. The pad 30a is formed to be connected to the wiring structure 20a. Accordingly, the wiring structure 20a and the pad 30a are formed as the conductors on the active area or the STI.

The TSV 60*a* serving as the metal electrode penetrates the substrate 10*a* from the fourth surface F2*a* to the third surface F1*a* of the substrate 10*a*. The TSV 60*a* electrically connects the conductors 20*a* and 30*a* to the pad 30*b* of the substrate 10*b*.

The spacer film 40*a* and the barrier metal 50*a* are formed between the substrate 10*a* and the TSV 60*a*. The barrier metal 50*a* prevents the metal material of the TSV 60*a* from diffusing into the silicon of the substrate 10*b*. The spacer film 40*a* electrically isolates the barrier metal 50*a* from the substrate 10*a*, isolates the TSV 60*a* from the substrate 10*a*, between the barrier metal 50*a* and the substrate 10*a*.

The substrate 10*b* serving as the first semiconductor substrate is stacked above the substrate 10*a*. The substrate 10*b* includes the first surface F1*b* having the semiconductor elements and the second surface F2*b* opposite to the first surface F1*b*. The semiconductor elements are formed in the active area of the substrate 10*b*. The wiring structure 20*b* is formed on the active area or the STI on the first surface F1*b* of the substrate 10*b* with the interlayer insulating film interposed therebetween. The semiconductor elements and the wiring structure 20*b* are covered with the insulating film 25*b*. The pad 30*b* is formed to be connected to the wiring structure 20*b*. Accordingly, the wiring structure 20*b* and the pad 30*b* are formed as the conductors on the active area or the STI.

The TSV 60*b* serving as the metal electrode penetrates the substrate 10*b* from the second surface F2*b* to the first surface F1*b* of the substrate 10*b*. The TSV 60*b* electrically connects the conductors 20*b* and 30*b* to bump 70*b*. The TSV 60*b* is also electrically connected to the TSV 60*a* of the substrate 10*a* via the conductors 20*b* and 30*b*.

The spacer film 40*b* and the barrier metal 50*b* are formed between the substrate 10*b* and the TSV 60*b*. The barrier metal 50*b* prevents the metal material of the TSV 60*b* from diffusing into the silicon of the substrate 10*b*. The spacer film 40*b* electrically isolates the TSV 60*b* and the barrier metal 50*b* from the substrate 10*b*, between the barrier metal 50*b* and the substrate 10*b*.

The bump 70*b* is formed on the TSV 60*b*. The bump 70*b* is used, for example, when the semiconductor device is connected to another semiconductor device.

Here, the spacer film 40*b* serving as an insulating film is formed in a first side surface F3*b* between an outer edge of the first surface F1*b* and an outer edge of the second surface F2*b* of the substrate 10*a*. In the dicing process, the dicing cutter DC cuts the substrates 10*a* and 10*b* in the first groove TRb of the dicing region Rdc. Accordingly, the spacer film 40*b* on the inner surface of the first groove TRb is left even after the dicing. Thus, as illustrated in FIG. 8, the spacer film 40*b* is formed on the first side surface F3*b*.

Depending on the depth of the first groove TRb, the spacer film 40*b* can cover the whole first side surface F3*b* of the substrate 10*b* or can cover a part of the first side surface F3*b* of the substrate 10*b*. When the first groove TRb reaches the substrate 10*a*, the spacer film 40*b* can also cover the whole or a part of a side surface F3*a* of the substrate 10*a*.

In this way, by covering the whole or a part of the first side surface F3*b* of the substrate 10*b* or covering the whole or a part of the side surface F3*a* of the substrate 10*a* with the spacer film 40*b*, it is possible to prevent metal contamination or the like of the substrates 10*a* and 10*b*.

In the foregoing embodiment, the two substrates 10*a* and 10*b* have been described, but the number of stacked substrates may be three or more. In this case, for example, n (where n is an integer equal to or greater than 2) substrates which are the same as the substrate 10*a* may be stacked and the substrate 10*b* may be stacked on the uppermost substrate. The depth of the first groove TRb may reach the plurality of substrates 10*a* below the substrate 10*b*.

Next, the plan layout of the first groove TRb will be described.

FIGS. 9A to 9D are sectional views illustrating an example of the layout of the first groove TRb. A region indicated by a dotted line is the dicing region Rdc. The drawings illustrate a part of the surfaces of the substrates 10*a* and 10*b*. A region indicated by a solid-line frame is the first groove TRb. The dicing region Rdc extends in the x direction on the second surface F2*b* and the y direction orthogonal to the x direction. A corner of an intersection of the x and y directions is a corner of a semiconductor chip.

Figure 9A:
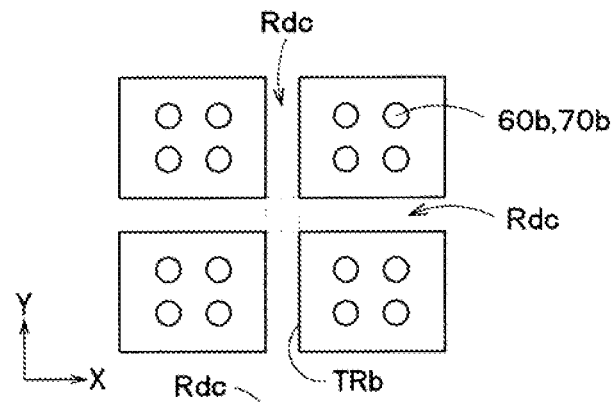
FIGS. 9A to 9D are sectional views illustrating an example of a layout of a first groove.

In FIG. 9A, the first groove TRb is formed on the whole dicing region Rdc. In this case, the dicing cutter can easily cut the substrates 10*a* and 10*b* in the dicing process. Since the mechanical strength of the substrates 10*a* and 10*b* in the dicing regions Rdc is lowered before the dicing, the substrates 10*a* and 10*b* crack in some cases, for example, at the time of conveying the substrates 10*a* and 10*b*. Accordingly, the first groove TRb can hardly be formed considerably deeply.

Figure 9B:
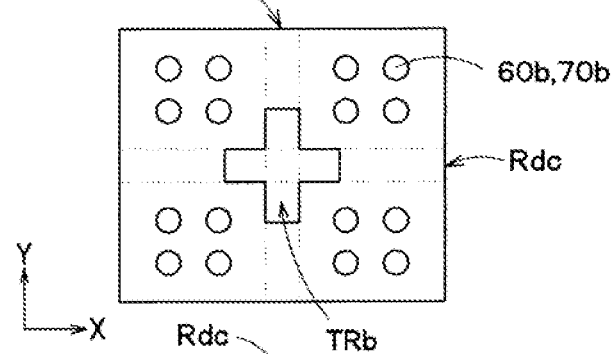

In FIG. 9B, the first groove TRb is formed at an intersection of the dicing regions Rdc. The first groove TRb is not formed in the dicing region Rdc other than the intersection (hereinafter referred to as a central portion). In the dicing process, the corners of the semiconductor chips are easily damaged. Accordingly, by forming the first groove TRb at the intersections of the dicing regions Rdc, it is possible to prevent the semiconductor chips from being damaged. In contrast, since the first groove TRb is not formed in the central portion of the dicing regions Rdc, the mechanical strength of the substrates 10*a* and 10*b* is not much lowered before the dicing. Accordingly, in the planar layout illustrated in FIG. 9B, it is possible to prevent the semiconductor chips from being damaged in the dicing process. In addition, it is possible to prevent the substrates 10*a* and 10*b* from cracking, for example, at the time of conveying the substrates 10*a* and 10*b*. In the case of the plan layout, the first groove TRb may be formed to reach the substrate 10*a*.

Figure 9C:
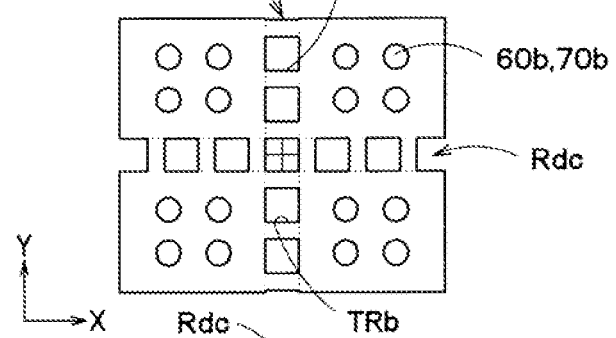

In FIG. 9C, perforated first grooves TRb are formed intermittently in the dicing regions Rdc. In other words, the substrate 10*b* is left in a ladder shape in the dicing regions Rdc. Thus, the mechanical strength of the substrates 10*a* and 10*b* before the dicing is not much lowered. Accordingly, in the planar layout illustrated in FIG. 9C, it is possible to prevent the semiconductor chips from being damaged in the dicing process. In addition, it is possible to prevent the substrates 10*a* and 10*b* from cracking, for example, at the time of conveying the substrates 10*a* and 10*b*. Accordingly, even in the layout illustrated in FIG. 9C, the first groove TRb may be formed to reach the substrate 10*a*.

Figure 9D:
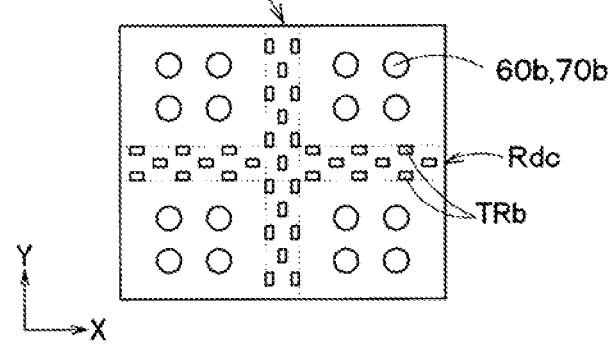

In FIG. 9D, many first grooves TRb smaller than the TSVs 60*b* are formed in the dicing regions Rdc. In this case, since an opening diameter of the first groove TRb is less than an opening diameter of the TSV 60*b*, the depth of the first groove TRb is shallower than the depth of the TSV 60*b*. Accordingly, the mechanical strength of the substrates 10*a* and 10*b* before the dicing is not much lowered. On the other hand, since many first grooves TRb are formed, it is easy to perform dicing in the dicing process. Thus, it is possible to prevent the semiconductor chips from being damaged.

In the first embodiment, the substrates 10*a* and 10*b* are stacked so that the fourth surface F2*a* of the substrate 10*a* faces the first surface F1*b* of the substrate 10*b*. In this case, an end of the TSV 60*a* of the substrate 10*a* on the side of the fourth surface F2a is thermally pressure-welded to the pad 30b of the substrate 10b, no bump is necessary. The TSV 60a is formed by a damascene method, as illustrated in FIGS. 3B and 4A. Hereinafter, the method of manufacturing the TSV 60a is referred to as a "TSV damascene forming method." In contrast, in order to connect an end of the TSV 60b of the substrate 10b on the side of the second surface F2b to an external semiconductor device or the like, the bump 70b is formed on this end. As illustrated in FIGS. 6B to 7B, the TSV 60b is formed using a lithography technology and an etching technology. Hereinafter, the method of manufacturing the TSV 60b is referred to as the "TSV lithography forming method."

Modification Examples

Figure 19:
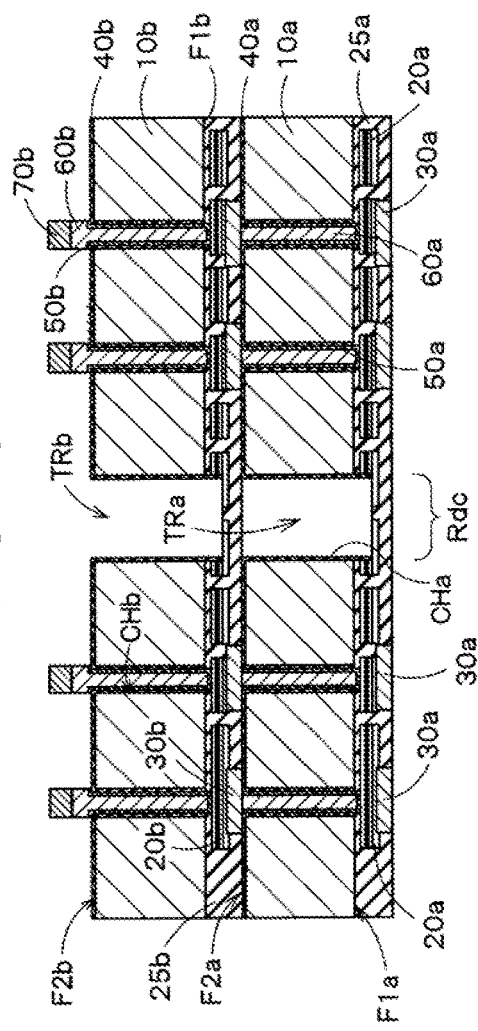
FIG. 19 is a sectional view illustrating an example of a method of manufacturing a semiconductor device according to a modification example of the first embodiment.

FIG. 19 is a sectional view illustrating a method of manufacturing a semiconductor device according to a modification example.

In the first embodiment, no groove is formed in a portion corresponding to the dicing region Rdc in the semiconductor substrate 10a when the contact hole CHa illustrated in FIG. 2A is formed. That is, the dicing region of the semiconductor substrate 10a is not etched.

However, as illustrated in FIG. 19, when the contact hole CHa is formed, a second groove TRa may be formed in the dicing region Rdc of the semiconductor substrate 10a. In this case, when the contact hole CHa illustrated in FIG. 2A is formed, the second groove TRa is formed in the dicing region Rdc of the semiconductor substrate 10a reaching from the fourth surface F2a to the third surface F1a by performing etching from the fourth surface F2a of the semiconductor substrate 10a as well as the contact hole CHa.

Next, as described with reference to FIG. 2B, the spacer film 40a is formed using a CVD method or an ALD method. At this time, the spacer film 40a also covers the inner surface of the second groove TRa. Next, as described with reference to FIG. 3A, the spacer film 40a is etched back by an RIE method. Thus, the spacer film 40a in the bottom portion of the second groove TRa is also etched. Next, a mask material covering the second groove TRa is formed. At this time, the mask material does not cover the first contact hole CHa. The barrier metal 50a and the TSV 60a are formed in the contact hole CHa using the mask material as a mask.

Thereafter, the mask material is removed and the semiconductor substrate 10b is stacked on the semiconductor substrate 10a so that the first surface F2b of the semiconductor substrate 10b is directed above the fourth surface F1a of the semiconductor substrate 10a, as described with reference to FIGS. 4A and 4B. The semiconductor substrate 10b is processed as in the first embodiment. Thus, a structure illustrated in FIG. 19 can be obtained.

Thereafter, the substrates 10a and 10b in the stacked state are diced. At this time, the dicing cutter DC cuts the substrate 10a and/or 10b in the dicing region Rdc via the first groove TRb and the second groove TRa illustrated in FIG. 19. Thus, the substrates 10a and 10b are singulated into stacked semiconductor chips. In the modification example, the same advantages as those of the first embodiment can be obtained.

The number of stacked semiconductor substrates is not limited to two, but may be three or more. In this case, the plurality of semiconductor substrates stacked below the semiconductor substrate 10b may be processed as the semiconductor substrate 10a.

Second Embodiment

FIGS. 10A to 10D are sectional views illustrating an example of a method of manufacturing a semiconductor device according to a second embodiment. FIGS. 10A to 10D are sectional views illustrating the entirety of substrates 10a and 10b. In FIGS. 10A to 10D, the conductors 20a, 30a, 20b, and 30b, the spacer films 40a and 40b, the barrier metals 50a and 50b, and the like are simplified or omitted. The same applies to the drawings subsequent to FIG. 11A.

In the second embodiment, the substrates 10a and 10b are stacked so that the third surface F1a of the substrate 10a faces the first surface F1b of the substrate 10b. The fourth surface F2a of the substrate 10a and the second surface F2b of the substrate 10b can thus be connected to an external semiconductor device or the like. Accordingly, in the second embodiment, the TSVs 60a and 60b of the substrates 10a and 10b are formed using the "TSV lithography forming method."

Figure 10A:
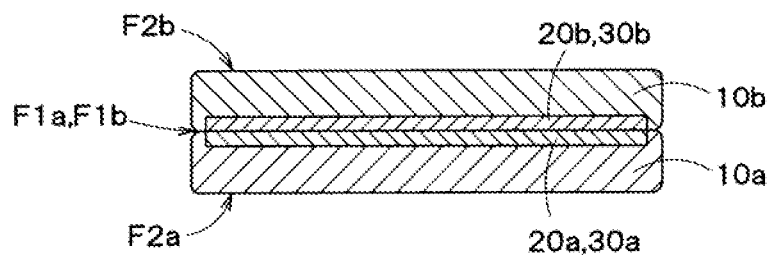
FIGS. 10A to 10D are sectional views illustrating an example of a method of manufacturing a semiconductor device according to a second embodiment.

For example, as illustrated in FIG. 10A, the substrates 10a and 10b are first stacked by bonding the third surface F1a of the substrate 10a to the first surface F1b of the substrate 10b.

Figure 10B:
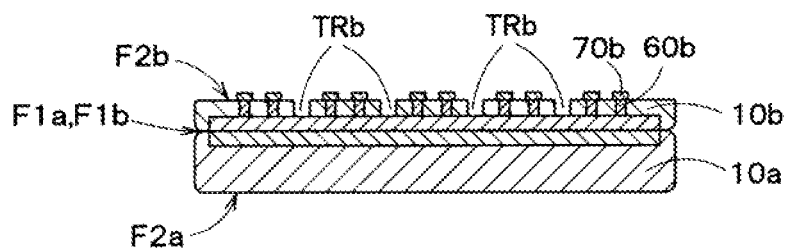

Next, the second surface F2b side of the substrate 10b is polished using a CMP method so that the substrate 10b is thinned. Thereafter, the TSV 60b is formed using the "TSV lithography forming method" As described previously herein. Accordingly, as illustrated in FIG. 10B, the bump 70b is formed on the TSV 60b. The first groove TRb is formed in the dicing region. The arrangement of the first groove TRb is different from the illustrated disposition in some cases.

Figure 10C:
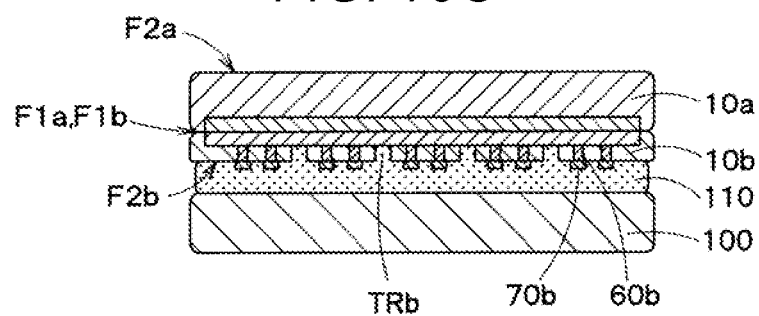

Next, as illustrated in FIG. 10C, the positions of the substrates 10a and 10b are reversed and the substrate 10b is adhered to a supporting substrate 100 by an adhesive 110. Thus, the fourth surface F2a of the substrate 10a is directed upwards. At this time, the bump 70b is buried in the adhesive 110 to be protected.

Figure 10D:
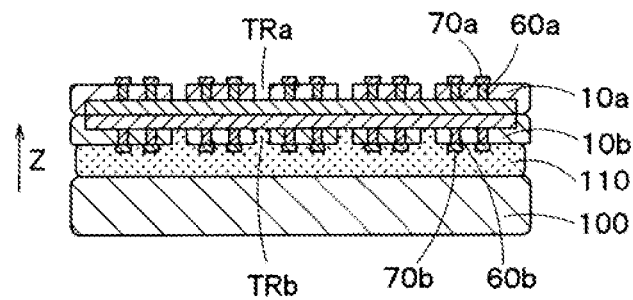

Next, the fourth surface F2a of the substrate 10a is polished using a CMP method so that the substrate 10a is thinned. Thereafter, the TSV 60a is formed using the "TSV lithography forming method" as described previously herein. Accordingly, as illustrated in FIG. 10D, the bump 70a is formed on the TSV 60a. The second groove TRa is also formed in the dicing region. The disposition of the second groove TRa may be different from the illustrated disposition in some cases. The method of forming the TSV 60a and the method of forming the second groove TRa may be the same as the methods of forming the TSV 60b and the first groove TRb, respectively.

For example, in the second embodiment, the substrate 10a is etched from the fourth surface F2a so that the second contact hole is formed to reach from the fourth surface F2a to the third surface F1a of the substrate 10a. The second contact hole corresponds to CHb in FIG. 5B. Simultaneously, the second groove TRa is formed in the dicing region serving as a second region of the fourth surface F2a of the substrate 10a. The second groove TRa corresponds to TRb in FIG. 5B. The position of the second groove TRa corresponds to the position of the first groove TRb. When z is the stacking direction of the substrates 10a and 10b, the second groove TRa is located immediately above or immediately below the first groove TRb in the z direction. The plan layout of the first groove TRb and the second groove TRa may be any one of FIGS. 9A to 9D.

Next, a second mask material is formed to cover the second groove TRa and expose the second contact hole. The second mask material corresponds to the resist film PR illustrated in FIG. 6A. The TSV 60*a* serving as a second metal electrode is formed in the second contact hole using the second mask material as a mask. Further, the bump 70*b* is formed on the TSV 60*a*. Thus, the structure illustrated in FIG. 10D can be obtained.

Thereafter, the substrates 10*a* and 10*b* are detached from the supporting substrate 100 and the adhesive 110, and then the substrates 10*a* and 10*b* are diced in the first groove TRb and the second groove TRa.

In this way, the substrates 10*a* and 10*b* may be stacked so that the third surface F1*a* faces the first surface F1*b*. Thus, the first groove TRb and the second groove TRa for dicing can be formed in both the substrates 10*a* and 10*b*. Accordingly, in the second embodiment, the dicing is easier. In the second embodiment, the same advantages as those of the first embodiment can be obtained.

Third Embodiment

FIGS. 11A to 11D are sectional views illustrating an example of a method of manufacturing a semiconductor device according to a third embodiment. In the third embodiment, two pairs of substrates 10*a* and 10*b* stacked so that the third surface F1*a* of one substrate 10 faces the first surface F1*b* of another substrate as described in the second embodiment. That is, in the third embodiment, four substrates 10*a*_1, 10*b*_1, 10*a*_2 and 10*b*_2 are stacked.

Figure 11A:
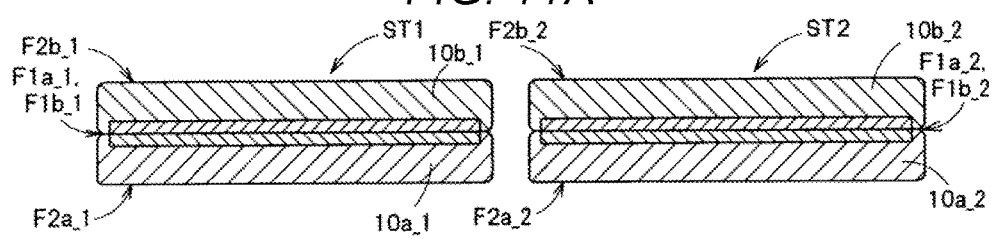
FIGS. 11A to 11F are sectional views illustrating an example of a method of manufacturing a semiconductor device according to a third embodiment.

As illustrated in FIG. 11A, the substrates 10*a*_1 and 10*b*_1 are stacked so that the third surface F1*a*_1 of the substrate 10*a*_1 faces the first surface F1*b* 1 of the substrate 10*b*_1. In addition, the substrates 10*a*_2 and 10*b*_2 are stacked so that the third surface F1*a*_2 of the substrate 10*a*_2 faces the first surface F1*b*_2 of the substrate 10*b*_2.

Figure 11B:
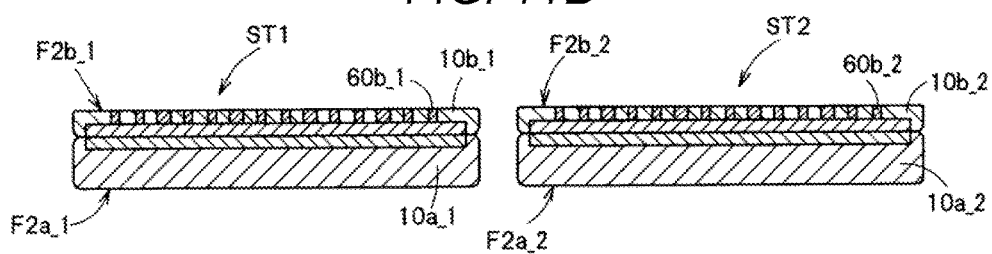
Figure 11C:
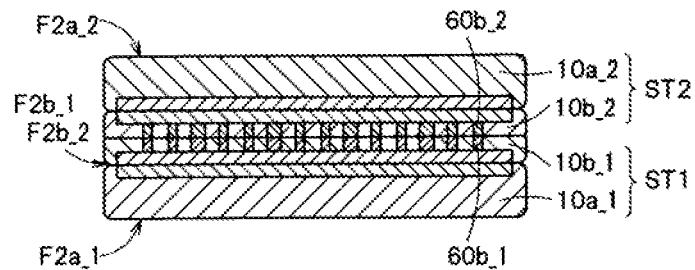

On the other hand, as illustrated in FIGS. 11B and 11C, the second surface F2*b*_1 of the substrate 10*b*_1 and the second surface F2*b*_2 of the substrate 10*b*_2 are joined in a facing relationship by thermal pressure welding. Accordingly, in the third embodiment, TSVs 60*b*_1 and 60*b*_2 of the substrates 10*b*_1 and 10*b*_2 are formed respectively using the "TSV damascene forming method."

TSVs 60*a*_1 and 60*a*_2 of the substrates 10*a*_1 and 10*a*_2 can be connected to an external semiconductor device or the like. Accordingly, the TSVs 60*a*_1 and 60*a*_2 of the substrates 10*a*_1 and 10*a*_2 are formed respectively using the "TSV damascene forming method."

For example, as illustrated in FIG. 11A, substrates 10*a*_1 and 10*b*_1 are first stacked by bonding the third surface F1*a*_1 of the substrate 10*a*_1 to the first surface F1*b*_1 of the substrate 10*b*_1. Separately, the substrates 10*a*_2 and 10*b*_2 are stacked by bonding the third surface F1*a*_2 of the substrate 10*a*_2 to the first surface F1*b*_2 of the substrate 10*b*_2. For convenience, the substrates 10*a*_1 and 10*b*_1 are referred to as a stacked body ST1 and the substrates 10*a*_2 and 10*b*_2 are referred to as a stacked body ST2.

Next, polishing is performed on the second surface F2*b*_1 side of the stacked body ST1 using a CMP method to this the substrate 10*b*_1. Polishing is performed on the second surface F2*b*_2 side of the stacked body ST2 to also thin the substrate 10*b*_2. Thereafter, the TSV 60*b*_1 and 60*b*_2 are formed using the "TSV damascene forming method." Accordingly, as illustrated in FIG. 11B, the bumps 70*b* are not formed on the TSVs 60*b*_1 and 60*b*_2. No groove is formed in the dicing region.

Next, as illustrated in FIG. 11C, the stacked body ST2 is flipped and stacked on the stacked body ST1. At this time, thermal pressure welding is performed so that the second surface F2*b*_2 of the stacked body ST2 faces the second surface F2*b*_1 of the stacked body ST1. Thus, the TSV 60*b*_1 and the TSV 60*b*_2 are electrically connected.

Figure 11D:
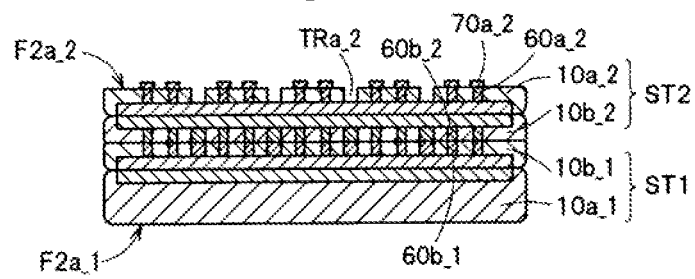

Next, polishing is performed on the fourth surface F2*a*_2 side of the stacked body ST2 using a CMP method to thin the substrate 10*a*_2. Thereafter, the TSV 60*a*_2 is formed using the "TSV lithography forming method." Accordingly, as illustrated in FIG. 11D, the bump 70*a*_2 is formed on the TSV 60*a*_2. The second groove TRa 2 is formed in the dicing region. The method of forming the TSV 60*a*_2 and the method of forming the second groove TRa_2 may be the same as the methods of forming the TSV 60*a* and the second groove TRa according to the second embodiment, respectively.

Figure 11E:
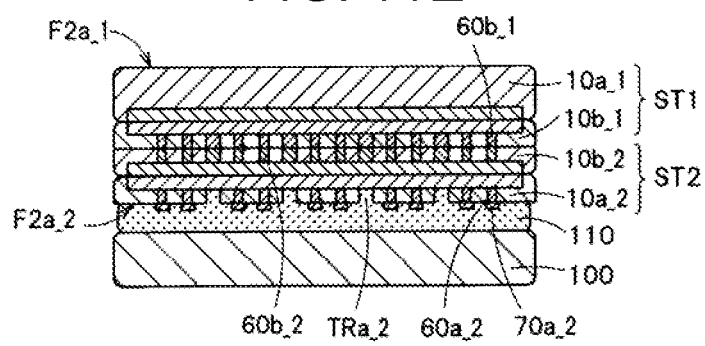

Next, as illustrated in FIG. 11E, the stacked bodies ST1 and ST2 are flipped and are adhered on the supporting substrate 100 by the adhesive 110. Thus, the fourth surface F2*a*_1 of the substrate 10*a*_1 is directed upwards. At this time, the bump 70*a*_2 is buried in the adhesive 110 to be protected.

Figure 11F:
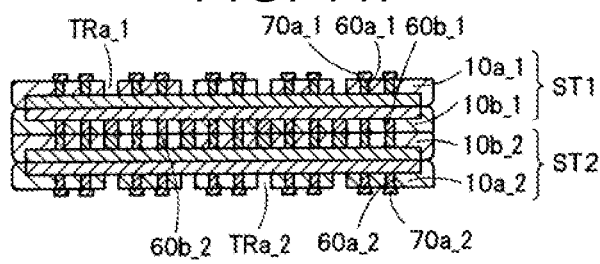

Next, polishing is performed on the fourth surface F2*a*_1 side using a CMP method to thin the substrate 10*a*_1. Thereafter, the TSV 60*a*_1 is formed using "the TSV lithography forming method." Accordingly, as illustrated in FIG. 11F, the bump 70*a*_1 is formed on the TSV 60*a*_1. The second groove TRa_1 is formed in the dicing region. The method of forming the TSV 60*a*_1 and the method of forming the second groove TRa_1 may be the same as the methods of forming the TSV 60*a* and the second groove TRa according to the second embodiment, respectively.

Thereafter, the stacked bodies ST1 and ST2 are diced in the grooves TRa_1 and TRa_2.

In this way, the stacked bodies ST1 and ST2 of which the first surfaces of two substrates face each other may further be stacked. In the third embodiment, the grooves TRa_1 and TRa_2 for dicing can be formed in both the substrates 10*a*_1 and 10*a*_2. Accordingly, in the third embodiment, the same advantages as those of the second embodiment can be obtained.

In the third embodiment, the two pairs of stacked bodies ST1 and ST2 have been described, but the number of stacked bodies to be stacked may be three or more. In this case, for example, n (where n is an integer equal to or greater than 2) pairs of stacked bodies of which both surfaces are formed by a damascene forming method may be stacked and the uppermost stacked body and the lowermost stacked body may be ST1 and ST2. The depths of the grooves TRa_1 and TRa_2 may be any depth from the uppermost stacked body to or from the lowest stacked body.

Fourth Embodiment

FIGS. 12A to 18 are sectional views illustrating an example of a method of forming a semiconductor device according to a fourth embodiment. The fourth embodiment is different from the first embodiment in that the TSV 60 and the first groove TR are formed together after the substrates 10*a* and 10*b* are stacked.

First, the substrates 10*a* and 10*b* are formed as in the first embodiment and the substrates 10*a* and 10*b* are thinned.

Next, as illustrated in FIG. 12A, the substrates 10*a* and 10*b* are joined by thermal pressure welding. In the fourth embodiment, the substrates 10*a* and 10*b* are stacked so that the fourth surface F2*a* of the substrate 10*a* faces the first surface F1*b* of the substrate 10*b*.

As illustrated in FIG. 12B, a patterned resist film PR is formed on the second surface F2*b* using a lithography technology. The resist film PR covers a region other than a region in which a contact hole for the TSV is formed and a region in which the first groove is formed on the second surface F2b.

Next, as illustrated in FIG. 13A, the substrates 10a and 10b are etched from the second surface F2b using the resist film PR as a mask by an RIE method. Thus, a contact hole CH reaching from the second surface F2b to the third surface F1a is formed. Simultaneously, the first groove TR is formed in the dicing region Rdc serving as the first region on the second surface F2b. As illustrated in FIG. 13B, the pad 30b is slightly etched in a direction transverse to the stacking direction of the substrates 10a and 10b. Thus, the pad 30b is depressed inwardly of the side surfaces of the substrates 10a and 10b in the transverse direction. The plan layout of the first groove TR may be any one of FIGS. 9A to 9D.

Figure 14A:
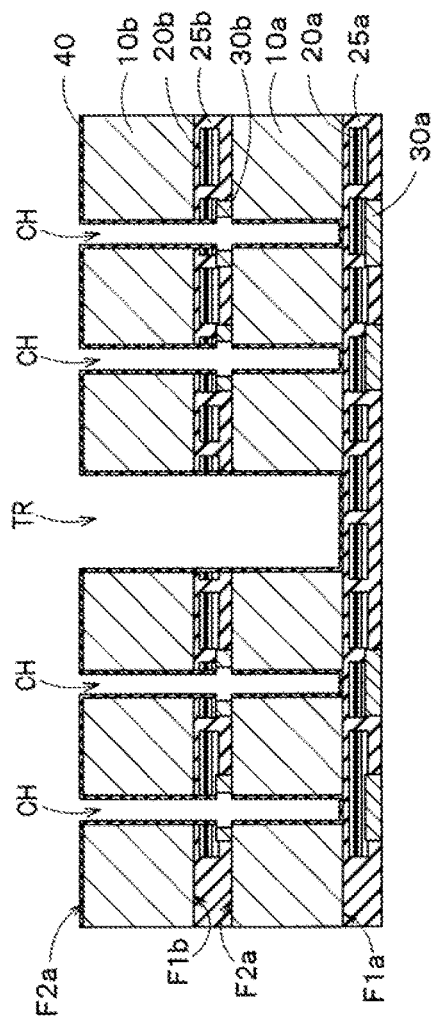
FIGS. 14A and 14B are sectional views illustrating an example of the method of manufacturing the semiconductor device after FIGS. 13A and 13B.
Figure 14B:
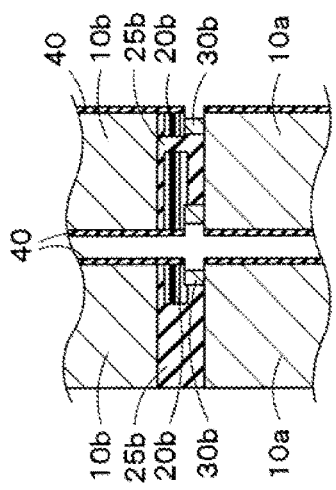

Next, as illustrated in FIG. 14A, the spacer film 40 is formed on the inner surface of the contact hole CH, the inner surface and the bottom surface of the first groove TR, and the second surface F2b of the semiconductor substrate 10b. Here, the side of the pad 30b is depressed inwardly of the side surfaces of the contact hole CH. Further, the contact hole CH has a high aspect ratio. Accordingly, as illustrated in FIG. 14B, it is difficult to form the spacer film 40 on the side surface of the pad 30b. Accordingly, the spacer film 40 is barely formed on the surface of the pad 30b or is considerably thin even when the spacer film 40 is elsewhere formed to its full desired thickness. The materials of the spacer film 40b and the barrier metal 50b may be the same as the materials of the spacer film 40a and the barrier metal 50a.

Next, the spacer film 40 in a bottom portion of the contact hole CH is etched by an RIE method. At this time, the small amount of spacer film 40 attached to the side surface of the pad 30b is also removed.

Figure 15A:
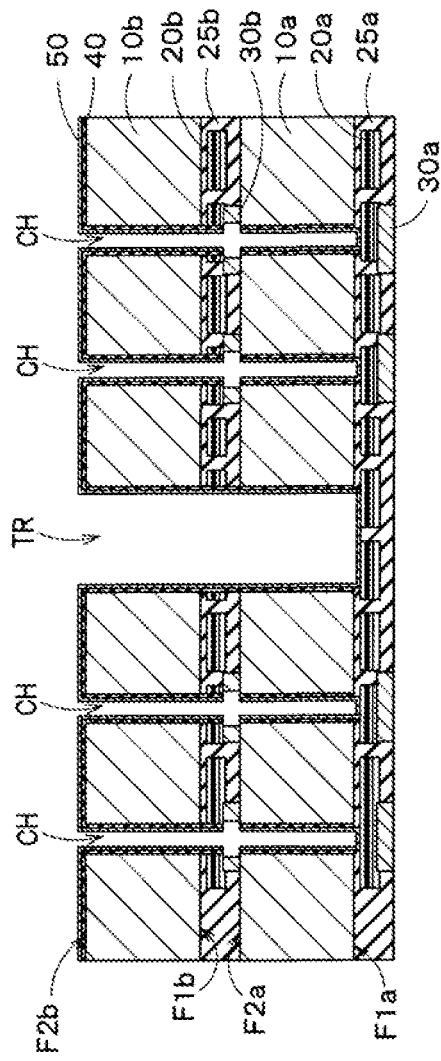
FIGS. 15A and 15B are sectional views illustrating an example of the method of manufacturing the semiconductor device after FIGS. 14A and 14B.
Figure 15B:
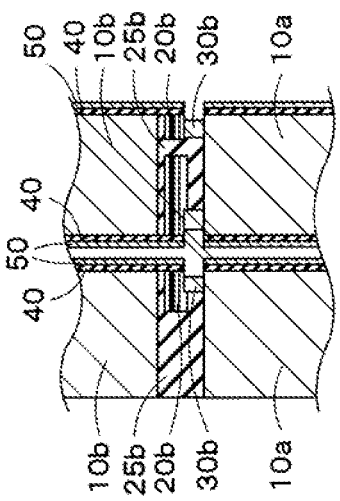

Next, as illustrated in FIG. 15A, the barrier metal 50 is formed in the contact hole CH. As illustrated in FIG. 15B, the barrier metal 50 is barely formed on the surface of the pad 30b or is considerably thinly formed, as was the spacer film 40.

Next, as illustrated in FIG. 16A, a region other than the contact hole CH and its peripheral region is covered with the resist film PR using a lithography technology. At this time, the resist film PR is also formed on the first groove TR to cover the first groove TR.

Next, the TSV 60 is deposited in the contact hole CH using the resist film PR as a mask. The TSV 60 enters even the depression along the side of the pad 30b to be also electrically connected to the pad 30b. Thus, the TSV 60 can be electrically connected to the conductors 20b, 30b, 20a, and 30a.

Next, the bump 70 is formed on the TSV 60 by a plating method using the resist film PR as the mask. After the resist film PR is removed, the barrier metal 50 is etched by wet etching using the upper portions of the bump 70 and the TSV 60 as a mask. Thus, as illustrated in FIG. 17, since the barrier metals 50 on the second surface F2b and on the inner surface and the bottom surface of the first groove TR are removed, the adjacent TSV 60 and bump 70 are electrically isolated from each other. In contrast, the barrier metal 50 immediately below the bump 70 and the TSV 60 remains, so that the TSV 60 and the bump 70 remain electrically connected to the conductors 20b, 30b, 20a, and 30a below the TSV 60 and the bump 70.

Figure 18:
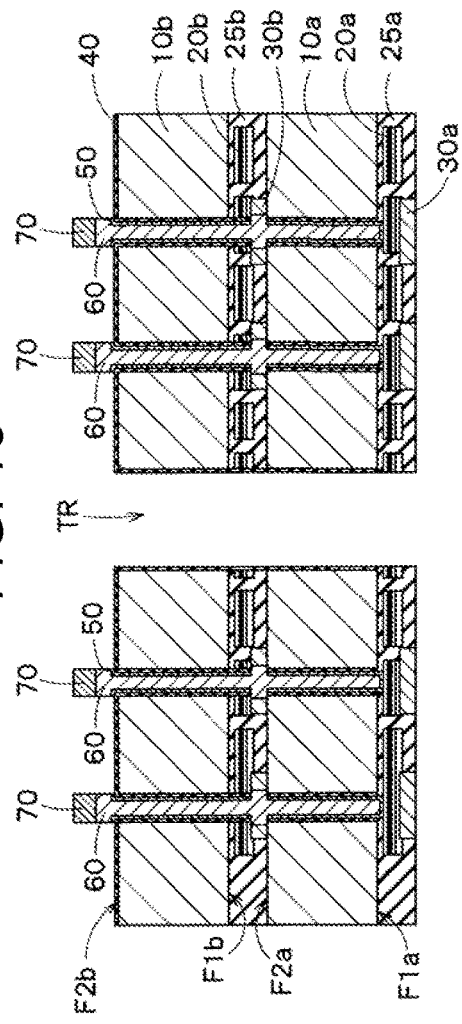
FIG. 18 is a sectional view illustrating an example of the method of manufacturing the semiconductor device after FIG. 17.

Thereafter, the substrates 10a and 10b in the stacked state are diced. At this time, the dicing cutter DC cuts the substrates 10a and 10b in the first groove TR. Thus, as illustrated in FIG. 18, the stacked substrates 10a and 10b are singulated into the stacked semiconductor chips. The stacked semiconductor chips are packaged with resin or the like to be completed as products.

According to the fourth embodiment, the dicing cutter DC cuts the inside of the first groove TR in the dicing process. Therefore, even when the plurality of stacked substrates 10a and 10b are diced at the same time, chipping, cracks, and the like rarely occur. Accordingly, in the fourth embodiment, the same advantages as those of the first embodiment can be obtained.

The spacer film 40 remains left on the inner wall of the first groove TR. Accordingly, after the substrates are singulated into semiconductor chips, the side surface of the substrates 10b and 10a is covered with the spacer film 40. Thus, it is possible to protect the substrates 10b and 10a from metal contamination or the like.

In the fourth embodiment, two substrates 10a and 10b have been described, but the number of substrates to be stacked together may be three or more. In this case, for example, n (where n is an integer equal to or greater than 2) substrates which are identical may be stacked and the first groove TR may be formed from the uppermost substrate. The depth of the first groove TR may be at any position from the uppermost substrate to the lowermost substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   stacking a first semiconductor substrate comprising a first surface having a semiconductor element and a second surface opposite to the first surface and a second semiconductor substrate comprising a third surface having a semiconductor element and a fourth surface opposite to the third surface;
   forming a first contact hole extending from the second surface to the first surface of the first semiconductor substrate and forming a first groove inwardly of a first region of the second surface of the first semiconductor substrate by etching inwardly of the first semiconductor substrate from the second surface thereof;
   forming a first patterned mask on the first semiconductor substrate, so that the first groove is covered by the material of the first patterned mask;
   forming a first metal electrode in the first contact hole through an opening in the first patterned mask as a mask; and
   removing the first patterned mask and subsequently cutting through the first semiconductor substrate in the first groove.

2. The method of manufacturing the semiconductor device according to claim 1, wherein
   the first and second semiconductor substrates are connected by bonding the first surface of the first semiconductor substrate to the third surface of the second semiconductor substrate, and the method further comprises:
   after removing the material of the first patterned mask, forming a second contact hole extending from the fourth surface to the third surface of the second semiconductor substrate and forming a second groove in a second region of the fourth surface of the second semiconductor substrate by performing etching inwardly of the fourth surface of the second semiconductor substrate;

forming a second patterned mask, so that the second groove is covered by the material of second patterned mask; and forming a second metal electrode in the second contact through an opening in the second patterned mask, wherein after the second patterned mask is removed, the first and second semiconductor substrates are cut through the first and second regions.

3. The method of manufacturing a semiconductor device according to claim 2, further comprising:

forming a conductive bump on a portion of the second metal electrode, wherein the material comprising the conductive bump is different than the material comprising the second metal electrode.

4. The method of manufacturing the semiconductor device according to claim 1, further comprising:

before stacking the first and second semiconductor substrates, forming a second contact hole reaching from the fourth surface to the third surface of the second substrate and forming a second groove in a second region of the fourth surface of the semiconductor substrate, by etching inwardly of the fourth surface of the second semiconductor substrate;

forming the first patterned mask on the second substrate, so that the second groove is covered by the material of the first patterned mask;

forming a second metal electrode in the first contact hole through an opening in the material of the first patterned mask; and after removing the material of the first patterned mask, connecting the first surface of the first semiconductor substrate with the fourth surface of the second semiconductor substrate to stack the first and second semiconductor substrates together.

5. The method of manufacturing the semiconductor device, according to claim 1, wherein the first contact hole is etched inwardly of the second surface of the first semiconductor substrate to extend from the second surface of the first semiconductor substrate to the third surface of the second semiconductor substrate, and the first groove is formed in the first region of the second surface of the first semiconductor substrate.

6. The method of manufacturing a semiconductor device according to claim 1, further comprising:

coating the opposed sidewalls of the groove with a protective layer.

7. The method of manufacturing a semiconductor device according to claim 1, wherein the first contact hole and the first groove are formed simultaneously.

8. The method of manufacturing a semiconductor device according to claim 7, wherein the first groove terminates inwardly of the first semiconductor substrate and the base thereof is spaced from the first surface.

9. A method of manufacturing a semiconductor device, the method comprising:

stacking a first semiconductor substrate comprising a first surface having a semiconductor element and a second surface opposite to the first surface and a second semiconductor substrate comprising a third surface having a semiconductor element and a fourth surface opposite to the third surface;

forming a first contact hole extending from the second surface to the first surface of the first semiconductor substrate and forming a first plurality of grooves, aligned in a first direction, inwardly of a first region of the second surface of the first semiconductor substrate by etching inwardly of the first semiconductor substrate from the second surface thereof;

forming a first patterned mask, so that the first plurality of grooves is covered by the material of the first patterned mask;

forming a first metal electrode in the first contact hole through an opening in the first patterned mask; and removing the first patterned mask and subsequently cutting through the first semiconductor substrate in the first plurality of grooves.

10. The method according to claim 9, further comprising:

forming a second plurality of grooves, aligned in a second direction different than the first direction, extending inwardly of a second region of the second surface of the first semiconductor substrate, by etching inwardly of the first semiconductor substrate from the second surface thereof.

11. The method according to claim 10, wherein at least one groove of the plurality of first grooves is aligned with the plurality of second grooves in the second direction.

12. The method according to claim 9, further comprising:

forming a protective layer along a sidewall of at least one of the grooves of the first plurality of grooves.

13. The method of claim 9, further comprising:

forming a conductive pad disposed between the first and second semiconductor substrates and contacting the first metal electrode.

14. The method of claim 9, further comprising:

forming a conductive bump on a portion of the first metal electrode.

* * * * *